United States Patent [19]

McNeilly et al.

[11] Patent Number: 5,294,568

[45] Date of Patent: Mar. 15, 1994

[54] METHOD OF SELECTIVE ETCHING NATIVE OXIDE

[75] Inventors: Michael A. McNeilly; Bruce E. Deal; Dah-Bin Kao; John de Larios, all of Palo Alto, Calif.

[73] Assignee: Genus, Inc., Sunnyvale, Calif.

[21] Appl. No.: 867,299

[22] Filed: Apr. 10, 1992

Related U.S. Application Data

[63] Continuation of Ser. No. 596,222, Oct. 12, 1990, abandoned.

[51] Int. Cl.$^5$ .......................................... H01L 21/02
[52] U.S. Cl. ................................. 437/235; 437/239; 437/243; 437/946; 148/DIG. 17; 148/DIG. 51; 156/646; 156/654; 156/662
[58] Field of Search ............... 156/646, 633, 654, 662; 437/235, 239, 243, 244, 946; 148/DIG. 17, DIG. 51

[56] References Cited

U.S. PATENT DOCUMENTS

| | | | |
|---|---|---|---|
| 4,127,437 | 11/1978 | Bersin et al. | 156/646 |
| 4,264,374 | 4/1981 | Beyer et al. | 437/946 |
| 4,605,479 | 8/1986 | Faith, Jr. | 148/DIG. 17 |
| 4,749,440 | 6/1988 | Blackwood et al. | 156/653 |
| 4,885,056 | 12/1989 | Hall et al. | 156/662 |

OTHER PUBLICATIONS

Miki et al., "Gas-phase selective etching of native oxide"; IEEE Transaction on Elec. Devices, vol. 37, No. 1, Jan. 1990, pp. 107–115.
Novak; "Anhydrous HF etching of native SiO$_2$: Application to Device Fabrication"; Solid State Tech; Mar. 1988; pp. 39–41.
P. A. M. van der Heide; "Etching of thin SiO$_2$ layers using wet HF gas"; J. Vac. Sci. Technol A 7(3); May/Jun. 1989; pp. 1719–1723.
Weston; "HF vapor phase etching (HF/VPE): production viability for semi-manufacturing and reaction model"; J. Vac. Sci. Tech., 17(1) Jan./Feb. 1980 pp. 466–469.
Bersin, "The DryOx process for etching Silicon Dioxide"; Solid State Tech. Apr. 1977; pp. 78–80.
Jun-Ru; "A new conformal dry-etch technique for submicrometer structures"; J. Vac. Sci. Tech. 19(4), Nov./Dec. 1981, pp. 1385–1389.
Beyer, "Silicon Surface Cleaning Process"; IBM Tech. Dis. Bulletin vol. 20, No. 5, Oct. 1977; pp. 1746–1747.
Beyer, "Removal of native oxide layer on a semiconductor surface"; IBM Tech. Dis. Bulletin; vol. 22, No. 7, Dec. 1979; p. 2839.

Primary Examiner—Tom Thomas
Assistant Examiner—Trung Dang
Attorney, Agent, or Firm—Joseph H. Smith; Donald R. Boys

[57] ABSTRACT

A method of selective etching of native oxide on a substrate is disclosed in which hydrogen halide vapor and water vapor are exposed to the substrate surface under appropriate conditions and long enough to remove native oxide but not long enough to remove any significant amount of other oxides. Treating conditions are maintained to prevent water vapor from condensing on the substrate until sufficient native oxide is etched so that substantially all the native oxide will be etched before appreciable other oxides are etched.

17 Claims, 9 Drawing Sheets

1

METHOD OF SELECTIVE ETCHING NATIVE OXIDE

This is a continuation of co-pending application Ser. No. 07/596,222 filed on Oct. 12, 1990, now abandoned.

The present invention relates in general to a method for selectively etching native oxide and as principally applicable to semiconductor device processing.

BACKGROUND OF THE INVENTION

In semiconductor device processing so-called "native" oxide films form on freshly etched silicon due to exposure in air, water or the etching chemicals themselves. Typically, this "native" or "chemical" oxide is 5-15 Å thick and contains all sorts of species in addition to $SiO_2$, such as C, H, F, S, N, and other metals.

In typical deposition processes, a thermal oxide is formed in a pattern on the silicon substrate for masking the covered substrate portions to permit treatment such as metal deposition in the remaining exposed surface. In removing the mask material after the thermal oxide is formed a native oxide has been formed. It is desirable to remove this native oxide prior to metal deposition without removing any or removing as little as possible of the adjacent thermal oxide. Since it has not been possible in the past to control oxide etching at levels such as 5-15 Å absolutely, it is generally the practice to over-etch. Thus, as much as 50 Å to 100 Å of the thermal oxide is etched, and often this amount of thermal oxide removal cannot be tolerated.

Most of the cleaning processes used today in the fabrication of semiconductors involve wet cleaning which leave or even cause native oxides which tend to degrade subsequent device properties.

P. J. Holmes and J. P. Snell "A Vapor Etching Technique for the Photolithography of Silicon Oxide", *MicroElectronics and Reliability*, Vol. 5, pp. 337-341, 1966, describe the use of vapor from a HF and $H_2O$ solution as the etchant for the photolithographic stage of planar silicon device technology. Similar vapor etching using HF from an aqueous solution is described by K. D. Beyer by himself or with others in the IBM Technical Disclosure Bulletin, "Etching $SiO_2$ in Gaseous $HF/H_2O$", Vol. 19, No. 7, p. 2513, December 1976, "Silicon Surface Cleaning Process", Vol. 20, No. 5, pp. 1746-1747, Oct. 1977, and "Removal of Native Oxide Layer on a Semiconductor Surface", Vol. 22, No. 7, p. 2839, Dec. 1979, and also reported in U.S. Pat. No. 4,264,734.

Two recent articles describe work in Japan on selective etching of native oxide using anhydrous HF. These are N. Miki, H. Kikuyama, M. Maeno, J. Murota, and T. Ohmi "Selective Etching of Native Oxide by Dry Processing Using Ultra Clean Anhydrous Hydrogen Fluoride," *Tech. Dig. of International Electron Devices Meeting*, pp. 730-733, San Francisco, DEC, 1988, and N. Miki, H. Kikuyama, I. Kawanabe, M. Miyashita and T. Ohmi "Gas-Phase Selective Etching of Native Oxide", *IEEE Transaction on Electron Devices*, Vol. 37, p. 107, 1990. These articles set forth that thermal oxide does not react with HF gas below the critical level of HF concentrations less than 4.7 vol. % in $N_2$ flow and native oxide is selectively etched away in HF concentrations in the range of 0.06 to 4.7%. The authors maintain that mixtures of HF and water vapor are too corrosive to gas supply systems and process chambers to be practical for cleaning. No differences are noted with respect to the time delay between initiation of etching native oxide and initiation of etching of thermal oxide.

Several dry etching techniques of thermal oxides have been described in the literature using hydrogen fluoride vapor. The article "The Dry Process for Etching Silicon Dioxide" by R. L. Bersin and R. F. Reichelderfer, *Solid State Technology*, Vol. 20, pp. 78-80, April 1970, and U.S. Pat. No. 4,125,437 by the same authors describe the use of ahhydrous hydrogen fluoride for etching silicon dioxide without damaging the underlying layer of silicon. In the article "HF Vapor Phase Etching: Production Viability for Semiconductor Manufacturing and Reaction Model" by D. F. Weston and R. J. Mattox, *J. Vac. Sci. Technol.*, Vol. 17, No. 1, pp. 466-469, Jan./Feb. 1980, a non-plasma silicon dioxide etch process using anhydrous hydrogen fluoride at reduced pressures is described involving the interaction of HF vapor with negative photoresist which catalyses subsequent etching beneath the photoresist. Ma Jun-Ru et al. in "A New Conformal Dry-Etch Technique for Submicrometer Structures", *J. Vac. Sci. Technol.*, Vol. 19, No. 4, pp. 1385-1389 describe a technique involving diffusion of gaseous HF and water vapor through an exposed resist for selective etching of the underlying $SiO_2$.

Use of anhydrous HF etching of native $SiO_2$ has been described in work by FSI International, Inc. Publications include R. E. Novak, "Anhydrous HF Etching of Native $SiO_2$: Applications to Device Fabrication", *Solid State Technology*, pp. 39-41, March 1988 and U.S. Pat. No. 4,749,440.

U.S. Pat. No. 4,695,327 describes the method of treating a semiconductor wafer by a solvent introduced into a chamber until its pressure is close to but below the vapor pressure of the liquid solvent at the temperature in question so that a plurality of molecular layers of solvent are absorbed in microrecesses and thereafter increasing the vapor pressure until the solvent condenses and wets the microrecesses. This patent suggests the use of hydrogen fluoride gas to remove the native oxide on a semiconductor surface and the use of a mixture of gaseous hydrogen chloride, gaseous water and gaseous hydrogen peroxide to remove metals that can be complexed and solvated from hydrophobic semiconductor materials.

SUMMARY OF THE INVENTION

Broadly stated, the present application is directed to a method for selective etching native oxides by exposing a substrate in a treatment chamber to hydrogen halide vapor and water vapor under appropriate conditions and long enough to remove the native oxide but not long enough to remove any significant amount of other oxides.

In accordance with a principal embodiment of the present invention, the hydrogen halide is either hydrogen fluoride or hydrogen fluoride and hydrogen chloride each derived from a separate aqueous solution or derived from a common aqueous solution whereby all of the native oxide is etched without any appreciable etching of other oxides such as thermal oxides and, CVD oxides.

An advantage of the present invention is that besides introducing fewer impurities, vapor phase hydrogen halide processing has much more etch uniformity and control then wet etching.

In accordance with another aspect of the present invention, the substrate is exposed to the hydrogen halide vapor and water vapor until vapor begins to condense on the substrate.

In accordance with still another aspect of the present invention, the treating conditions are maintained to prevent water vapor from condensing on the substrate until sufficient native oxide is etched so that substantially all of the native oxide will be etched before appreciable other oxides are etched. The temperature of the substrate and/or vapor and/or the pressure of the vapor are controlled to prevent vapor from condensing on the substrate until the native oxide is removed.

In accordance with another aspect of the invention, other hydroxyl containing substances can serve as replacements for the water.

These and other aspects, features and advantages of the present invention will be better appreciated upon a perusal of the following specification and the accompanying drawing wherein similar characters of reference refer to similar elements in each of the several views.

DESCRIPTION OF THE DRAWINGS

FIG. 1A is a block diagram of the process steps for treating a semiconductor substrate as shown in the elevational sectional view of FIG. 1B to produce a substrate as shown in elevational sectional view FIG. 1B. FIG. 1C is a graph of pressure versus time plotted for the process steps shown in FIG. 1A, and FIG. 1D is a graph of oxide etched plotted versus time for a typical embodiment of this invention.

DESCRIPTION OF THE PREFERRED EMBODIMENT

Figure 1A:
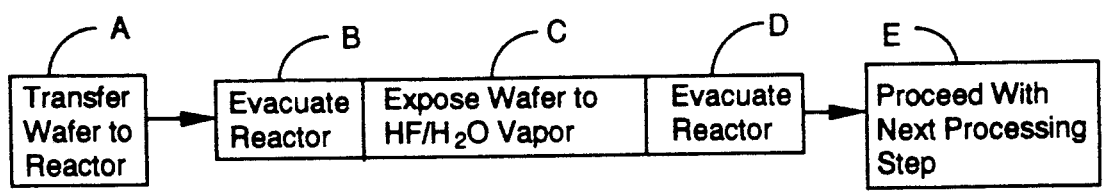
FIGS. 1A-1D are schematic views illustrating the invention correlated together.
Figure 1C:
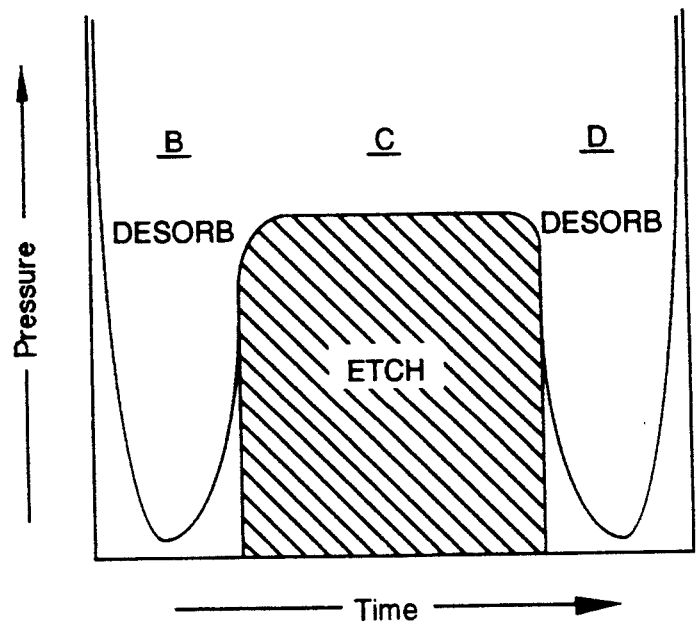

Referring now to the drawing with particular reference to FIGS. 1A-1D, there is shown a preferred embodiment of applicants' vapor phase selective etching of native oxide.

In the first step A of this process, as shown in FIG. 1A, a semiconductor wafer or substrate is either existing in or is transferred to a reactor or reactor chamber. At this time in the process, the wafer W, shown in FIG. 1B, has patterns of thermal oxide T.O. grown (or a chemically vapor deposited oxide) on a substrate S and on which native oxide N.O. exists in the openings of the thermal oxide.

In the next step B of FIG. 1A, the reactor is evacuated such as to about 1 Torr to remove and desorb contaminates from the chamber and the surface of the wafer W. Next, in step C a hydrogen halide vapor such as HF vapor and water vapor or HF vapor, HCl vapor and water vapor in an inert carrier gas such as nitrogen is passed through the reactor chamber for exposing the oxides on the substrate to the $HF/H_2O$ or $HF/HCl/H_2O$ at about 350 Torr to begin the selective etching of the native oxide. The evacuation step B and exposure step C for etching the native oxide are graphically illustrated in FIG. 1C which is a plot of pressure versus time in the reactor chamber.

Figure 1D:
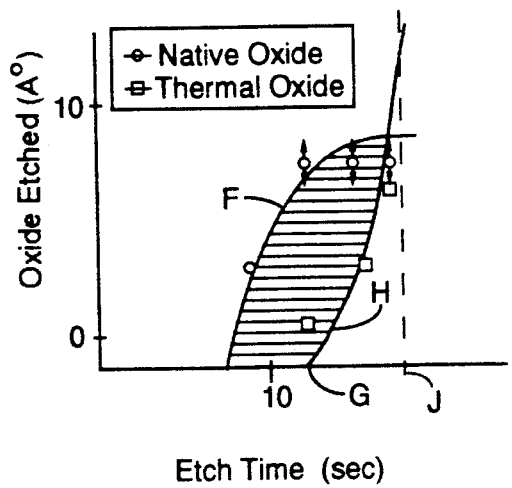

During the exposure or etch step C there is an initial time delay before which etching of the native oxide occurs. FIG. 1D is a graph of oxide etched in angstroms plotted versus etch time. FIG. 1D shows in one curve F the native oxide etched in the process after a further time delay to a point in time designated G when the native oxide is mostly if not all etched away and the thermal oxide begins to etch as indicated by curve H.

In the next step D of FIG. 1A, the etching is halted at the point in time designated J by ceasing exposure of the wafer to the etchant vapor and evacuating the reactor chamber such as to the low milliTorr range to remove both the etchant vapor from the chamber as well as the reaction products of the vapor etching process. In the particular embodiment illustrated in FIG. 1D, some thermal oxide is etched before etching of the native oxide is terminated at time J.

Figures 1, 1B:
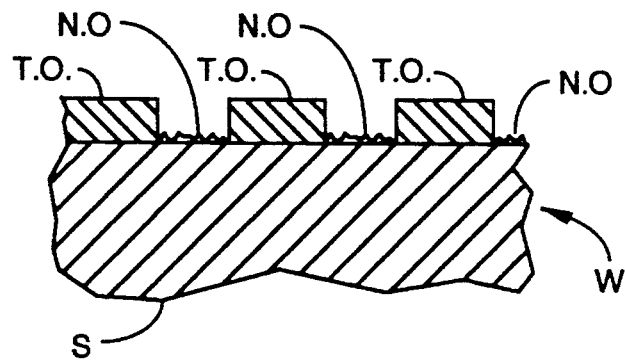

Finally, as step E of Fig. 1A the wafer with the native oxide removed, but without removal of appreciable thermal oxide as shown in FIG. 1B, is treated to the next processing step which may be performed in the same reactor chamber or in other treating apparatus.

While we do not wish to be bound by any particular theory of operation, we believe that native oxide etching is initiated and performed by $HF/H_2O$ in vapor phase, perhaps in conjunction with a different chemical make up and/or with $H_2O$ adsorbed in the native oxide, whereas the thermal oxide etching is typically not initiated until vapor condenses on the thermal oxide surface. The time offset after native oxide etching begins and before the thermal oxide begins to be etched permits the removal of the native oxide. Other deposited oxides operate similar to the thermal oxide although some begin etching more quickly than the thermal oxides.

Figures 1, 1B, 2:
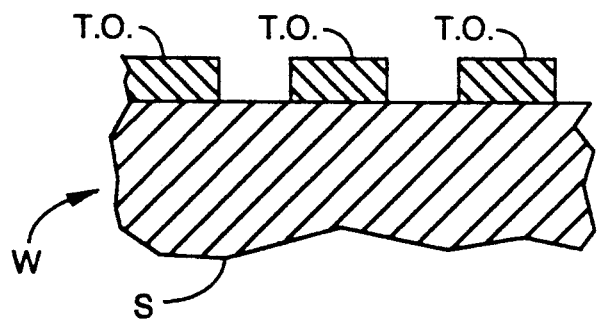
FIG. 2 is a schematic view, partially in flow diagram manner and partially in elevational sectional view illustrating apparatus for performing this invention.
Figure 2:
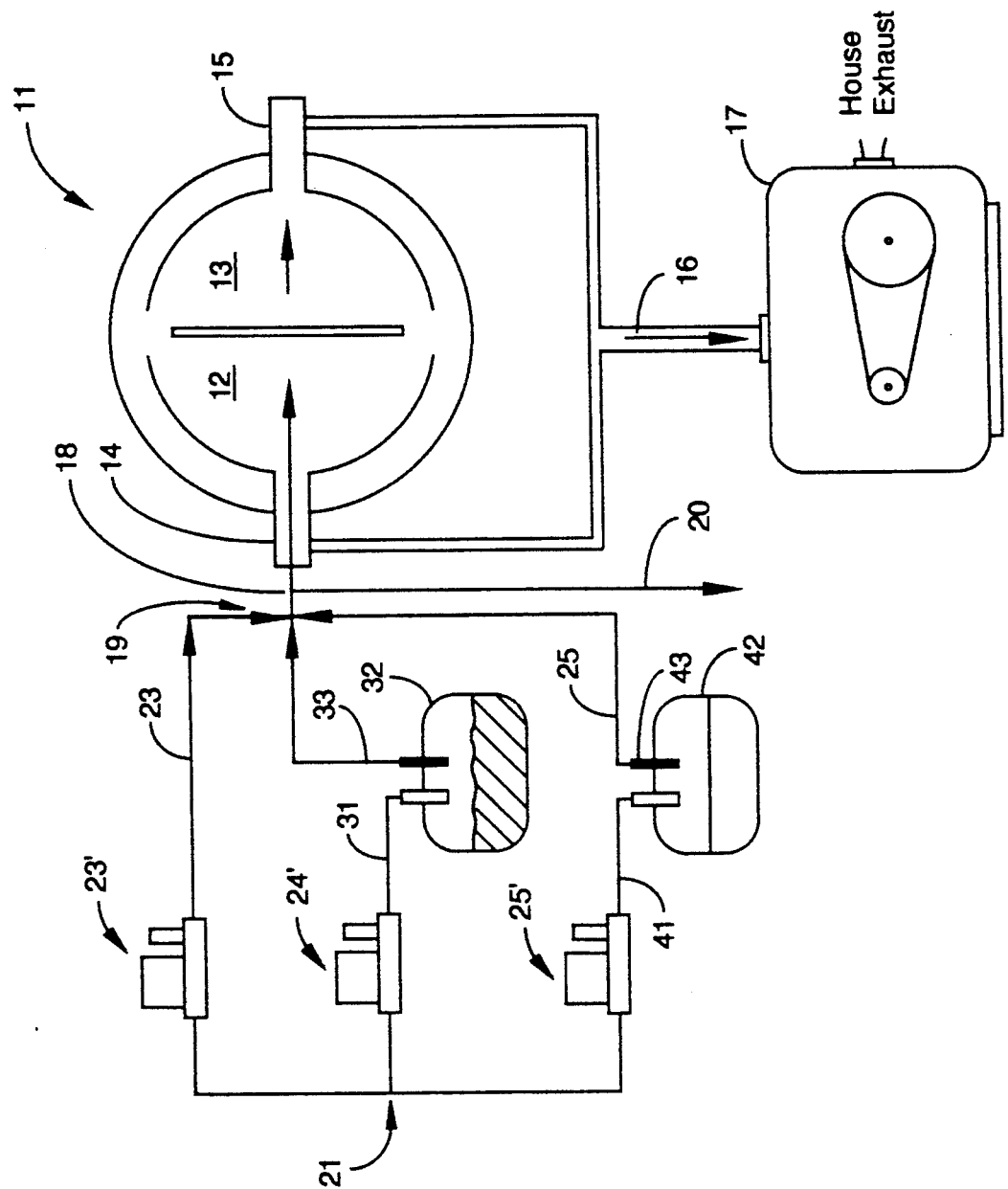

Referring now to FIG. 2, there is illustrated apparatus for performing the invention including a reactor 11 for treating one or both sides of a wafer W. The reactor 11 can take the form of the reactor described in U.S. Pat. No. 4,778,559, assigned to the same assignee as the present application and comprising a pair of chambers 12 and 13, such as of solid silicon carbide, mounted on a horizontal axis on opposite sides of the wafer W positioned vertically along the horizontal axis within the reactor 11. Each of the chambers 12 and 13 can include a pair of hollow spherical or cylindrical spaced apart walls centered on the horizontal axis so that a treating gas can be directed along the horizontal axis through the inner wall into the chambers toward the wafer and withdrawn through the annular space between the walls. Alternatively, the treating gas can be directed axially into one chamber toward the wafer and withdrawn from the other chamber.

In accordance with the present invention the wafer is supported for removing native oxide typically as one step in a number of automated steps of processing the wafer. This native oxide removal step typically occurs a number of different times during the fully automated processing of a given wafer.

Chamber 12 is shown with an inlet 14 at which gaseous media can be directed toward the wafer W, and chamber 13 is shown with an outlet 15 through which the gaseous media including reaction products from the chamber is withdrawn through a manifold 16 by a vacuum pump 17.

The vapor phase media is directed to the reactor 11 through a line 18 from a mixing block 19 which receives media from one or more of the lines 23 (delivering inert gas such as nitrogen), 24 (delivering hydrogen fluoride and water vapor), and 25 (delivering water vapor or hydrogen chloride and water vapor). A vent line 20 is provided for line 18. An inert carrier gas 21 such as nitrogen from a source (not shown) is directed to mass flow controllers 23', 24' and 25' in the lines 23, 24 and 25 respectively. Gas and vapor at suitable pressures, temperatures and flow rates are delivered from the lines 23-25 to the mixing block 19 and then via line 18 to the reactor 11.

For delivering HF/H$_2$O vapor from line 24, the N$_2$ carrier gas from the mass flow controller 24' is dirrected via a line 31 to a HF source 32 which is an azeotropic aqueous solution of HF and H$_2$O. A sizable volume of HF/H$_2$O mixture is kept in a plastic container immersed in a constant temperature heating bath and stirred by a magnetic stirrer, not shown. The nitrogen carrier gas 21 is passed over the surface of the HF/H$_2$O liquid at a constant flow rate. The N$_2$/HF/H$_2$O mixture exiting the source 32 is passed through an insulated teflon tube 33 that is heated to or above the temperature of the liquid so as to prevent condensation in the tubing. Suitable bypass and purges lines and valves (no shown) can be provided for bypassing the HF source 32 and purging the line 24.

The vapor line 25 includes components 41–43 similar to the elements 31–33, respectively, except that the source 42 contains just water or an aqueous solution of HCl or another desired solution.

It has been discovered possible to expose the semiconductor substrate or wafer W to hydrogen halide vapor such as HF or HF/HCl and water vapor long enough such as for up to 20 to 30 seconds to remove native oxide but not long enough to remove a significant amount of other oxides.

Figure 3:
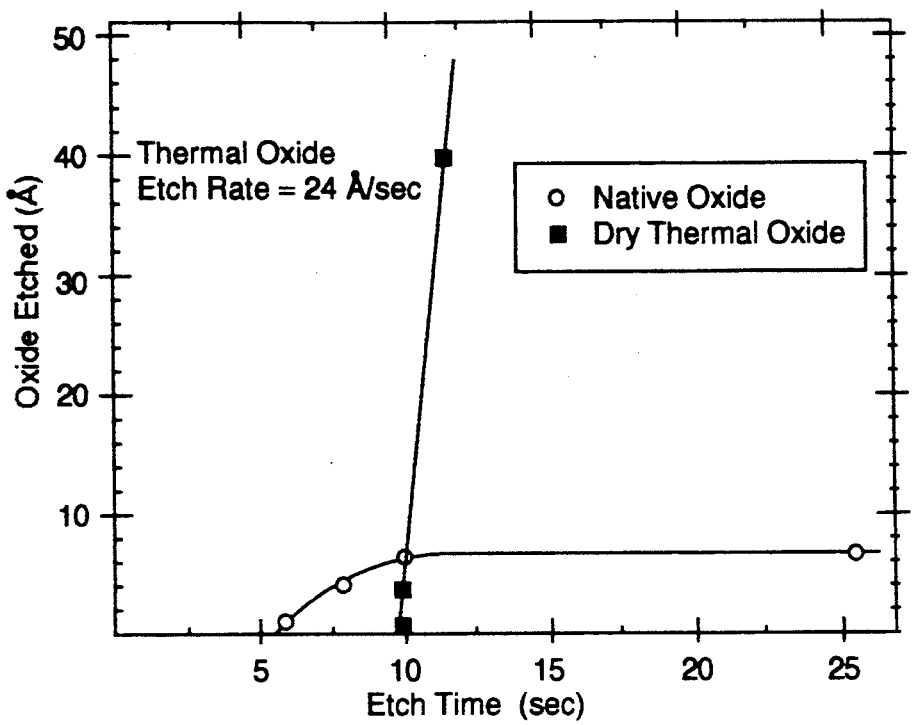
FIGS. 3 and 4 are graphs of the oxide etched and etch time utilizing the present invention.

FIG. 3 shows a graph of the oxide etched plotted versus time for native oxide and thermal oxide for specific conditions. The etching conditions were 350 Torr chamber pressure using HF/H$_2$O vapor from vaporizer 32 containing 38.4 wt. % HF in HF/H$_2$O solution at 50° C. combined and delivered with a N$_2$ carrier at 7.5 l/m and H$_2$O vapor from vaporizer 42 at 50° C. delivered with a N$_2$ carrier at 7.5 l/m. The native oxide began to be etched after about 4 seconds and essentially all of the native oxide was etched in after ten seconds before thermal oxide began to be etched.

Figure 4:
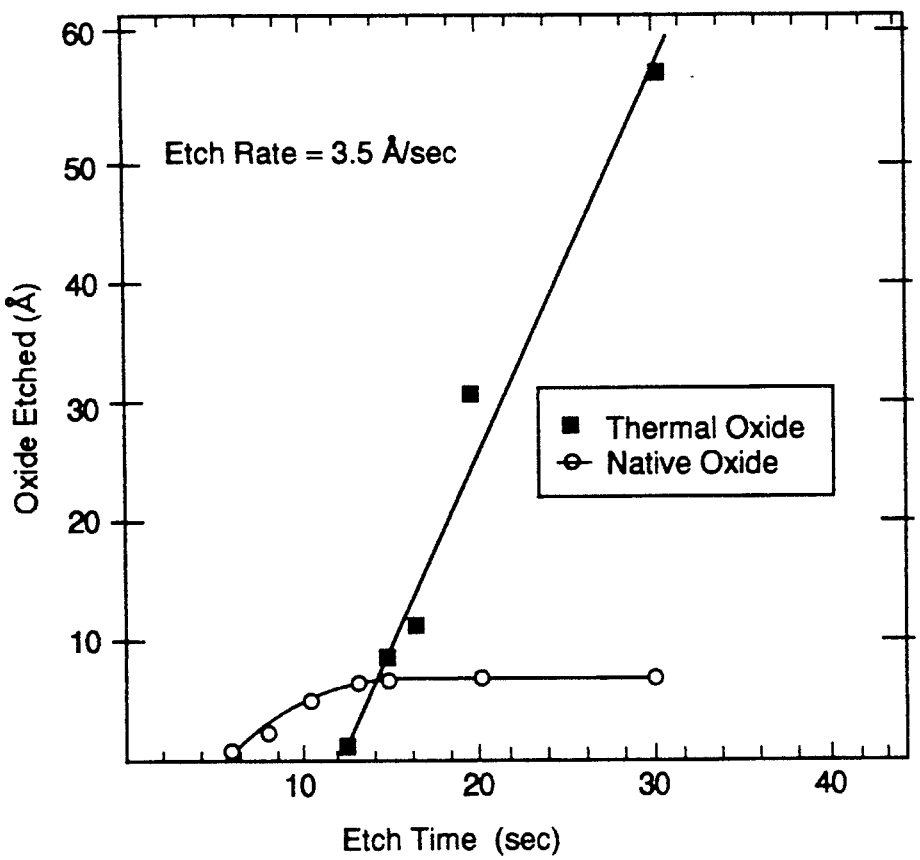

FIG. 4 illustrates another etching operation for selective native oxide etching at 350 Torr chamber pressure and vapor from a 38.4 wt. % HF in HF/H$_2$O solution from vaporizer 32 at 23° C. combined and delivered by a N$_2$ carrier at 2.5 l/m with water vapor from vaporizer 42 at 65° C. via a N$_2$ carrier at 12.5 l/m which produced an etch rate 3.5 Å/sec. This low thermal oxide etch rate allows slight over etching for insuring total removal of the native oxide without etching more than 10 Å of thermal oxide.

The lower the amounts of HF relative to H$_2$O the lower the etch rate and therefore the greater the control of the selective etching of native oxide verses thermal oxide. In accordance with this invention the HF can be as low as 0.1 percent and as high as 49 weight percent of water.

Figure 5:
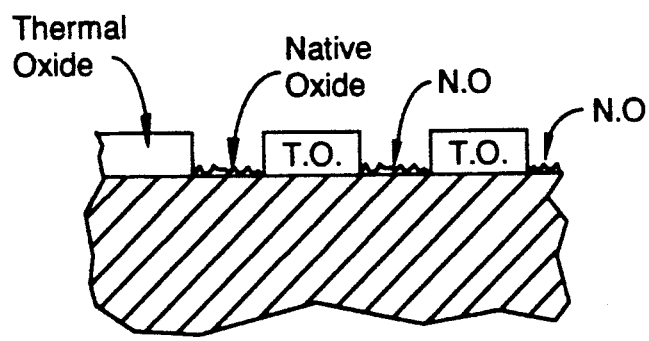
FIG. 5 is an elevational sectional view of a portion of a semiconductor wafer illustrating use of the invention as applicable to the graphed results shown in FIG. 6 in which oxide etched is plotted versus etch time.
Figure 6:
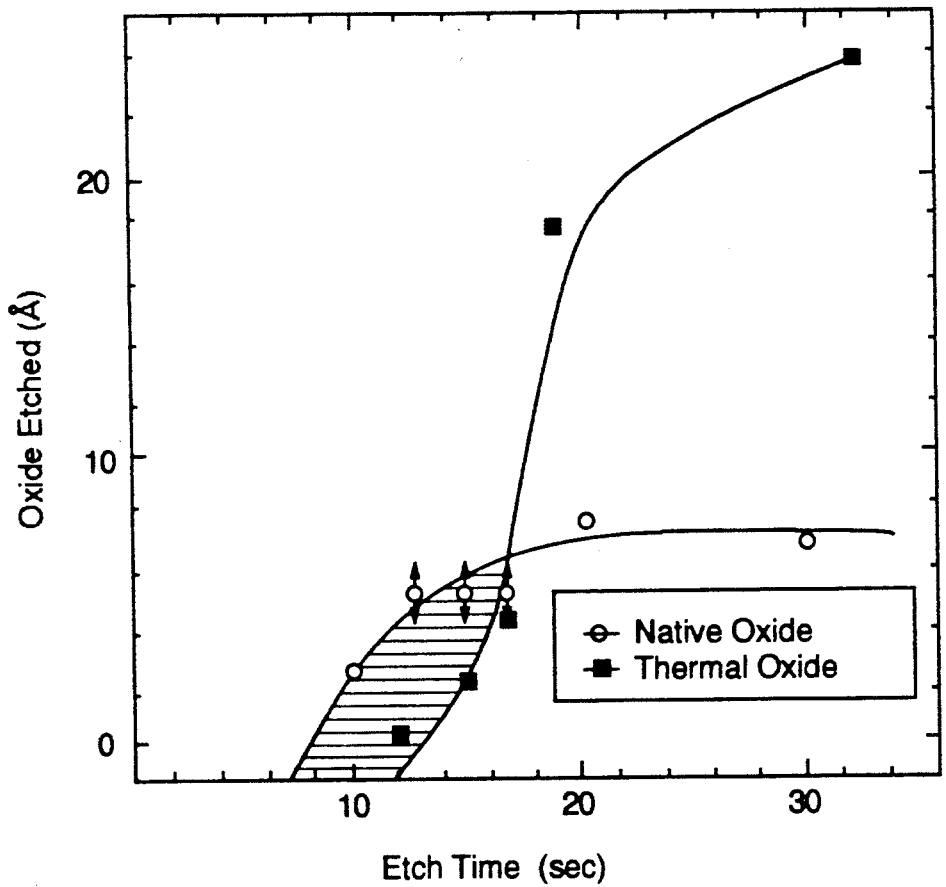

FIGS. 5 and 6 schematically illustrate the original cross section of a wafer surface and the etching characteristics, respectively, for selective native oxide etching distributed over a 4 inch diameter wafer with an original thermal oxide 1000 Å thick, the openings in which were wide enough to measure the native oxide thickness with a Gaertner Ellipsometer. Utilizing HF/H$_2$O from vaporizer 32 at 30° C. flowing at 1 l/m and H$_2$O from vaporizer 42 at 60° C. flowing at 14 l/m, oxide was etched at the rate of 2.9 Å/sec.

By controlling etch times to the value of 2.9 Å/sec it was possible to demonstrate that the native oxide could be essentially removed before the thermal oxide started etching. Thus, for the 12 second etch time all the native oxide that was to be etched was etched and less than 1 Å of thermal oxide was etched.

Figure 7:
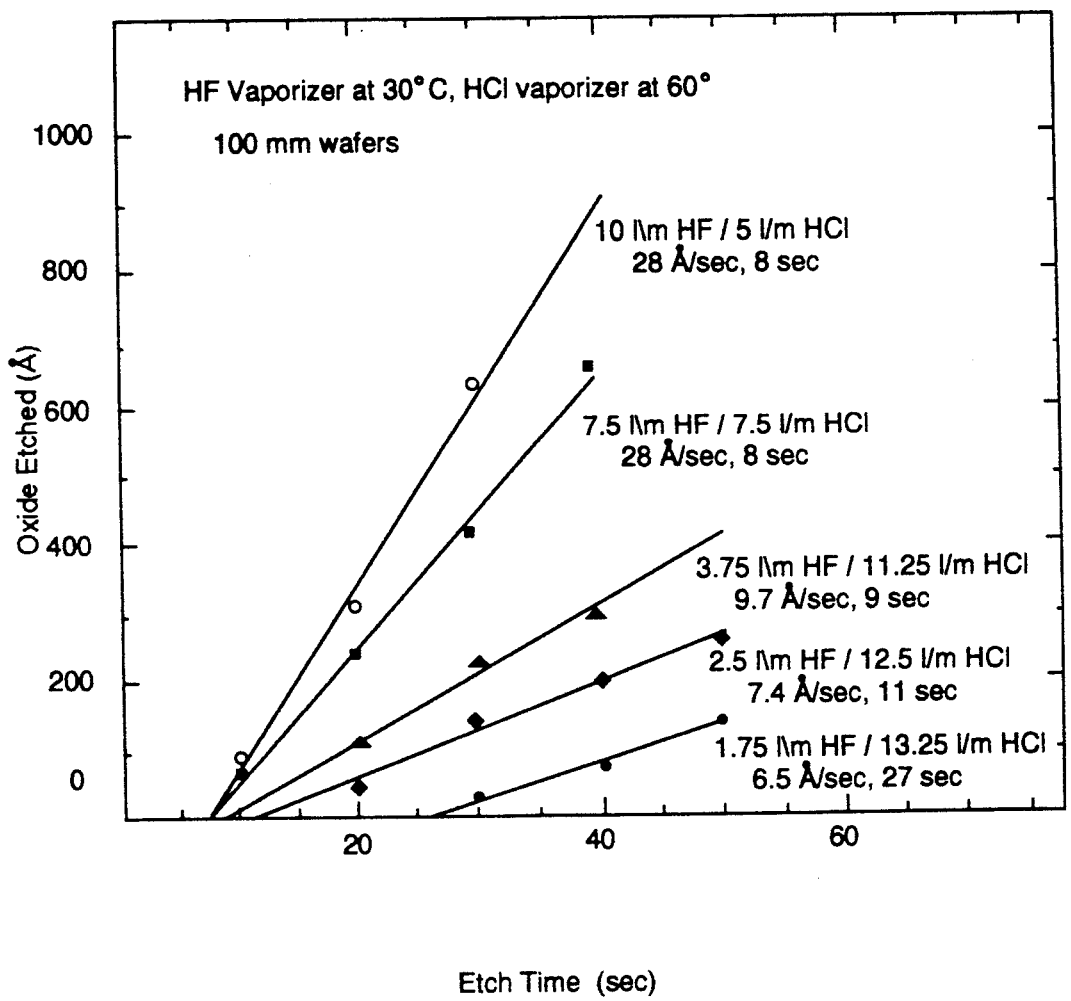
FIG. 7 is a graph of thermal oxide etched versus time for various combinations of $HF/HCl/H_2O$.

FIG. 7 illustrates an embodiment of the present invention using a combination of HF/HCl/H$_2$O vapor for etching just thermal oxide and utilizing 38.4 wt. % HF from HF/H$_2$O at 30° C. in vaporizer 32 and 20.2 wt. % HCl from HCl/H$_2$O at 60° C. in vaporizer 41. By progressively reducing the flow from 10 l/m HF/H$_2$O and 5 l/m HCl/H$_2$O to 1.75 l/m HF/H$_2$O and 13.25 l/m HCl/H$_2$O it was possible to reduce the etch rate from 28 Å/sec. after etching for 8 sec. to 6.5 Å/sec. after 27 sec. This 27 second time offset before initiation of thermal oxide etching permits all of the native oxide to be removed before removing any appreciable thermal oxide.

Figure 8A:
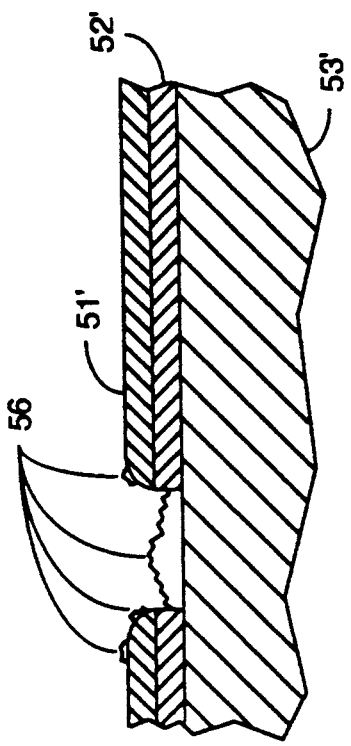
FIGS. 8A and 8B are elevational sectional views of a portion of a semiconductor wafer in prior art processing steps.
Figure 8B:
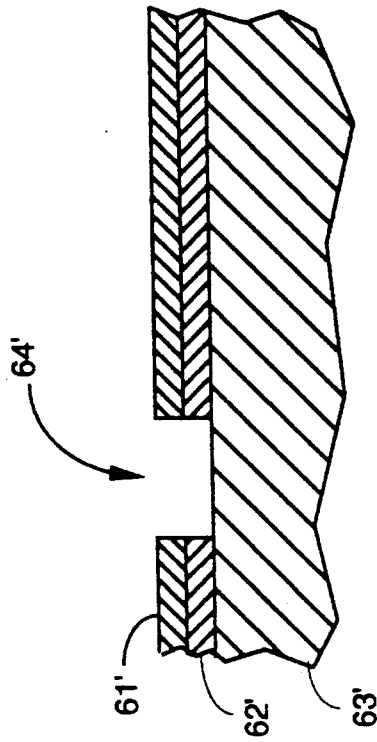

FIGS. 8A, 8B, 9, 10 and 11 concern etching of heavy phosphorus-doped boron-phosphate-silicon-glass (BPSG). FIGS. 8A and 8B illustrate operation under the typical prior art techniques in which an BPSG dialectic layer 51 exists on top of a thermal or CVD oxide layer 52 which in turn is on a silicon substrate 53. Before metal is deposited in the contact opening 54, some sort of etch must be used to remove the high-resistant chemical or native oxide 55 in the opening. What normally occurs after attempting to etch the native oxide, as illustrated in FIG. 8B, is that not only is the native oxide not removed but additional residues 56 from the phosphorus-fluoride-containing byproducts fill up the opening. In addition, the opening is severely sloped toward the top causing additional problems in insulation between device cells. Much improved results were obtained with the present invention.

Figure 9:
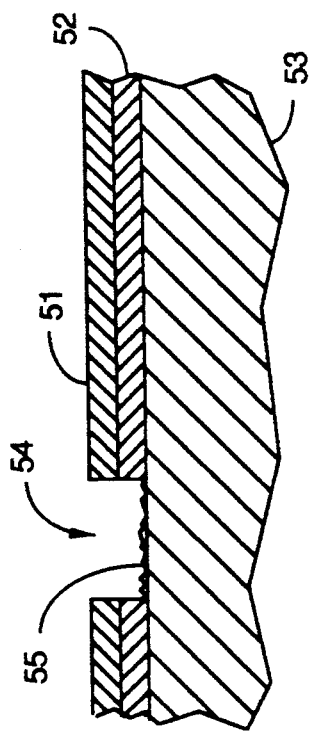
FIGS. 9 and 10 are elevational sectional views similar to FIG. 8B but illustrating operation of the present invention.

FIG. 9 illustrates a schematic elevational view of an opening 64 in the BPSG layer 61 after etching the native oxide with HF/H$_2$O vapor as described above. The HF/H$_2$O vapor etch of the native oxide resulted in much better retention of the opening dimensions, but still left residues 66 in the opening 64 and on the BPSG surface 61. A simple dip in deionized water removed this residue quite completely, but, of course, deionized water will re-introduce native oxide.

Figure 10:
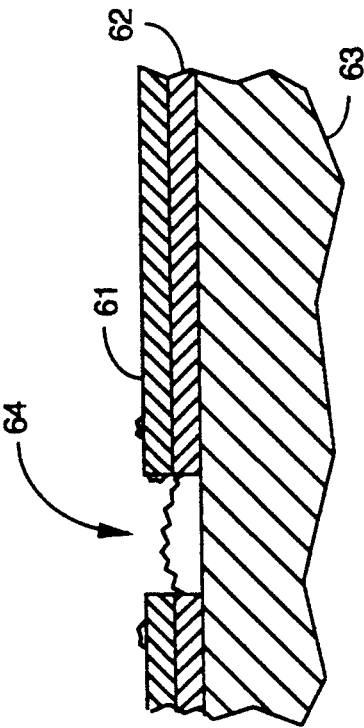
Figure 11:
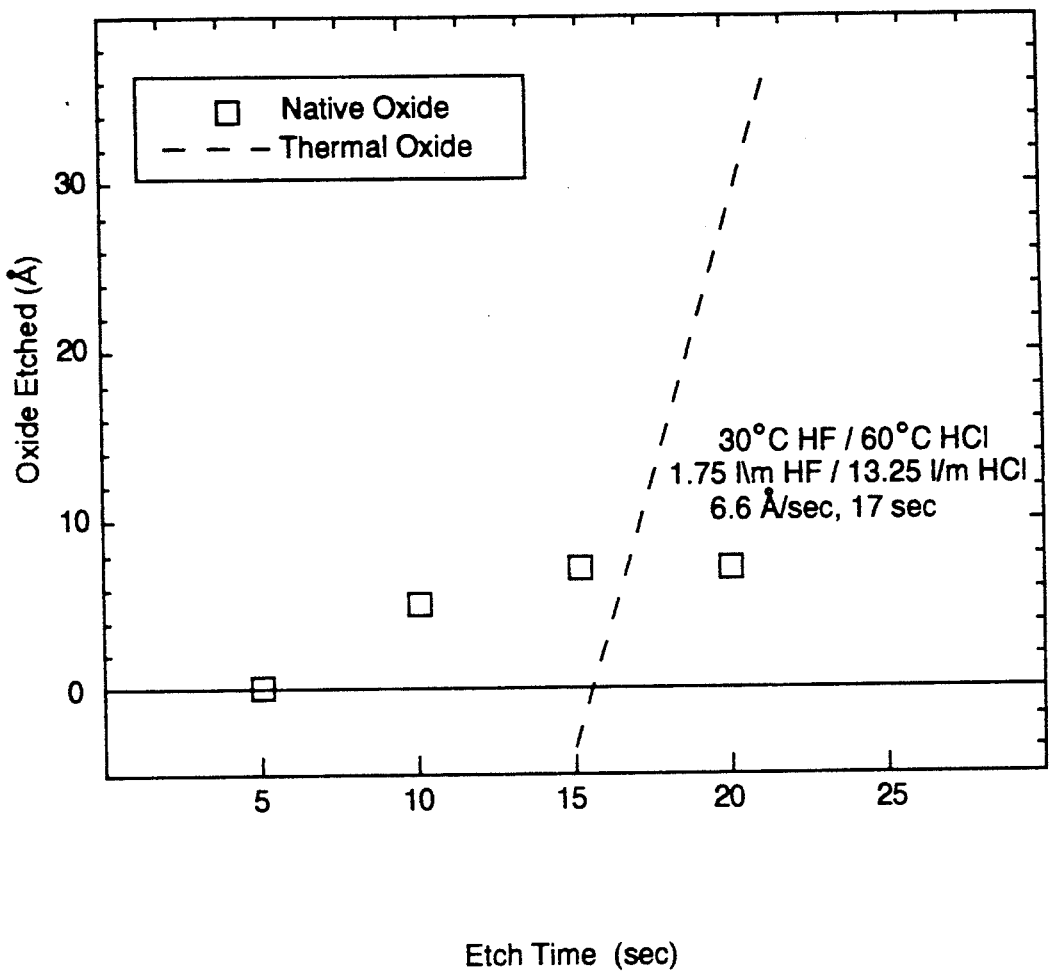
FIG. 11 is a graph showing the process performed to achieve the result shown in FIG. 10.

FIG. 10 illustrates etching of the native oxide in the opening of a BPSG layer 61' on a thermal oxide 62' on a silicon substrate 63' using HF/H$_2$O and HCl/H$_2$O selective etch for about 10 seconds with a low etch rate of 6.6 Å/sec. as illustrated in FIG. 11. It was determined that the native oxide was successfully removed and that very little phosphorus or boron residue resulted.

Figure 12:
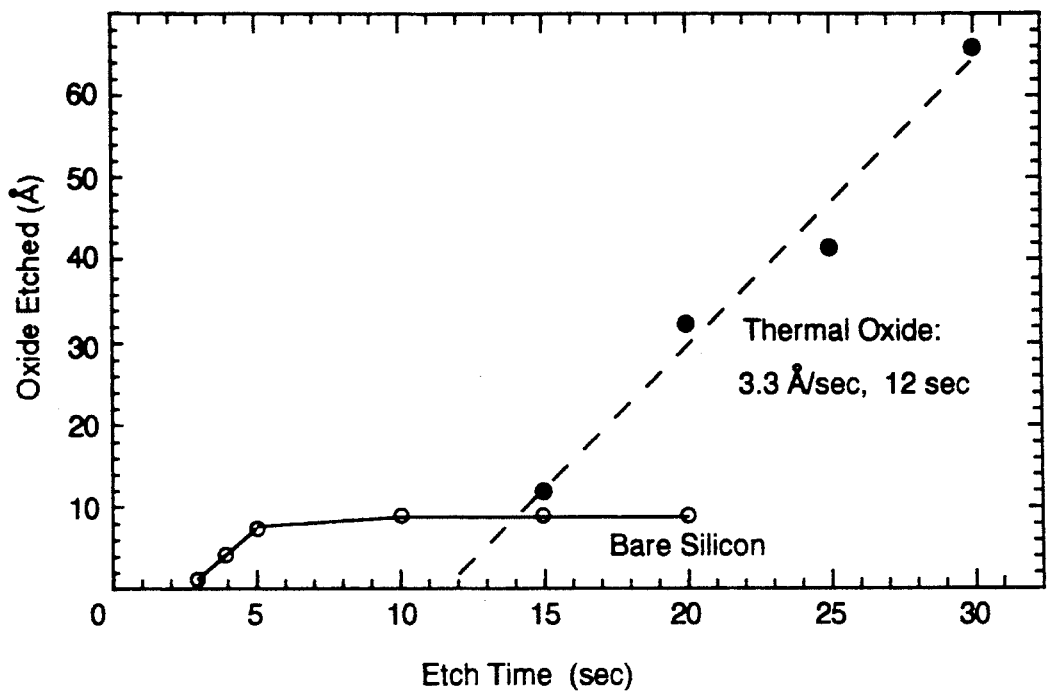
FIG. 12 is a graph of oxide etched verses etch time illustrating another application of the present invention.

FIG. 12 is an illustration of the use of the $HF/H_2O$ and $HCl/H_2O$ in accordance with the present invention and wherein native oxide exists on a conventional wafer. $HF/H_2O$ vapor combined and delivered with a $N_2$ carrier at 1 sl/m from a vaporizer containing 38.4 wt. % HF in a $HF/H_2O$ solution at 30° C. and $HCl/H_2O$ vapor combined and delivered with a $N_2$ carrier at 14 sl/m from a vaporizer containing 20.2 wt. % HCl in a $HCl/H_2O$ solution at 60° C produced an etch rate of 3.3 Å/sec after 12 seconds.

While the invention has been described above with reference to HF vapor and water vapor or HF vapor, HCl vapor and water vapor as the vapor etchant, other hydroxyl-containing substances could serve as a replacement for the water. Appropriate hydroxyl-containing replacements are ethyl alcohol, methyl alcohol and isopropyl alcohol.

Figure 13:
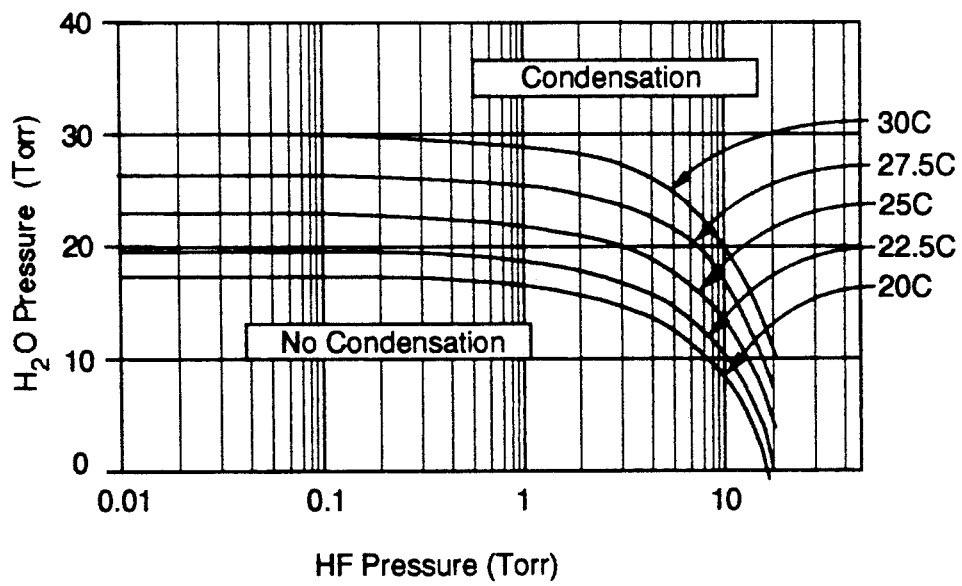
FIG. 13 is a graph of $H_2O$ partial pressure plotted against HF partial pressure to show the $H_2O$ and HF partial pressure ranges for $H_2O$ condensation for various temperatures.

Since native oxide can be etched with $HF/H_2O$ vapor and $HF/HCl/H_2O$ vapor before condensation of vapor on the thermal oxide surface, condensation of the vapor on the thermal oxide is preferably controlled to increase the time available to etch the native oxide before initiation of thermal oxide etch. Temperatures and pressures are controlled to defer initiation of condensation. It has been discovered that in the $HF/H_2O$ vapor process of the present invention, the liquid $HF/H_2O$ does not condense if the wafer temperature is above about 27°-28° C. Accordingly, applicants' process includes provision for heating the wafer above about 27°-28° C. such as up to 30° C. via the semiconductor substrate heater described in U.S. Pat. No. 4,778,559 or with infrared or ultraviolet energy. Alternatively, the water vapor partial pressure in the reactor can be reduced to delay condensation of water vapor on the thermal oxide. FIG. 13 is a graph of $H_2O$ partial pressure plotted against HF partial pressure to show the $H_2O$ and HF partial pressure ranges for $H_2O$ condensation for various temperatures.

It will be appreciated by those skilled in the art that in the embodiments described above the HF and HCl constituent of the etching vapor could be derived from an anhydrous source as long as there is an appropriate source of water vapor.

The terms and expressions which have been employed here are used as terms of description and not of limitation, and here is no intention in the use of such terms and expressions, of excluding equivalents of the features shown and described, or portions thereof, it being recognized that various modifications are possible within the scope of the invention claimed.

What is claimed is:

1. The method for processing semiconductor wafers comprising the steps of:
    positioning a substrate in a treatment chamber;
    exposing the substrate to a mixture of hydrogen halide vapor and water vapor to etch native oxide from a surface of the substrate; and
    controlling the partial pressure of at least one of the vapors to delay condensation of water vapor on other oxide surface while native oxides are being etched.

2. In the method of claim 1 said exposing step comprising exposing the substrate to at least 0.1 wt. percent hydrogen halide in water.

3. In the method of claim 2 said exposing step comprising exposing the substrate to no more than 49 weight percent hydrogen halide in water.

4. In the method of claim 1 forming the hydrogen halide vapor and water vapor from hydrogen halide in an aqueous solution.

5. In the method of claim 4 forming the hydrogen halide from hydrogen fluoride in an aqueous solution.

6. In the method of claim 4 forming the hydrogen halide from hydrogen fluoride in an aqueous solution and hydrogen chloride in an aqueous solution.

7. In the method of claim 4 forming the hydrogen halide from hydrogen fluoride and hydrogen chloride in an aqueous solution.

8. The method for processing semiconductor wafers comprising the steps of:
    positioning a substrate in a treatment chamber;
    controlling the temperature of the substrate;
    exposing the substrate to a mixture of hydrogen halide vapor and either water vapor or a vapor of a hydroxyl-containing replacement for water vapor to etch native oxides from a surface of the substrate; and
    controlling the partial pressure of at least one of the vapors to delay condensation of water vapor on the other oxides while native oxides are being etched.

9. In the method of claim 8 said exposing step comprising exposing the substrate to at least 0.1 wt. percent hydrogen halide or hydroxyl containing replacement in water.

10. In the method of claim 9 said exposing step comprising exposing the substrate to no more than 49 wt. percent hydrogen halide or hydroxyl containing replacement in water.

11. In the method of claim 8 forming the hydrogen halide vapor and water vapor from hydrogen halide in an aqueous solution.

12. In the method of claim 11 forming the hydrogen halide vapor from hydrogen fluoride in an aqueous solution.

13. In the method of claim 11 forming the hydrogen halide from hydrogen fluoride in an aqueous solution and hydrogen chloride in an aqueous solution.

14. In the method of claim 11 forming the hydrogen halide from hydrogen fluoride and hydrogen chloride in an aqueous solution.

15. The method for processing semiconductor wafers comprising the steps of:
    positioning a semiconductor wafer in a treatment chamber;
    controlling the temperature of the wafer;
    vaporizing an aqueous solution containing an hydrogen halide;
    mixing a carrier gas with said vaporized aqueous solution producing a mixture of said vaporized aqueous solution and said carrier gas;
    exposing a surface of said wafer to said mixture; and
    controlling the partial pressures of at least one of the vapors to delay condensation of water vapor on other oxides surface while native oxides are being etched.

16. In the method of claim 15 forming the hydrogen halide from hydrogen fluoride in an aqueous solution.

17. In the method of claim 15 forming the hydrogen halide from hydrogen fluoride in an aqueous solution and hydrogen chloride in an aqueous solution.

* * * * *